United States Patent
Gaide et al.

(10) Patent No.: US 10,110,202 B1
(45) Date of Patent: Oct. 23, 2018

(54) DISTRIBUTED VOLTAGE AND TEMPERATURE COMPENSATION FOR CLOCK DESKEWING

(71) Applicant: Xilinx, Inc., San Jose, CA (US)

(72) Inventors: Brian C. Gaide, Erie, CO (US); John G. O'Dwyer, Maynooth (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/451,778

(22) Filed: Mar. 7, 2017

(51) Int. Cl.
*H03K 3/011* (2006.01)
*H03K 5/15* (2006.01)
*H03K 5/19* (2006.01)
*H03K 5/00* (2006.01)

(52) U.S. Cl.
CPC ........... *H03K 3/011* (2013.01); *H03K 5/1508* (2013.01); *H03K 5/19* (2013.01); *H03K 2005/00143* (2013.01)

(58) Field of Classification Search
CPC ........ H03K 3/011; H03K 5/1508; H03K 5/19; H03K 2005/00143
See application file for complete search history.

(56) References Cited

U.S. PATENT DOCUMENTS 7,453,302 B2 * 11/2008 Le ............................ G11C 7/04
327/262
9,143,122 B1   9/2015 Gaide

* cited by examiner

*Primary Examiner* — Jung Kim
(74) *Attorney, Agent, or Firm* — Gerald Chan

(57) ABSTRACT

An apparatus for clock deskew includes: a first delay element configured to receive a clock signal from a clock, wherein the delay element comprises multiple delay lines; a first multiplexer coupled to the multiple delay lines; a sensor configured to sense a voltage, a temperature, or both, and to provide a sensor output based at least on the sensed voltage and/or the sensed temperature; and a converter configured to receive the sensor output, and to generate a converted signal; wherein the first multiplexer is configured to provide a delay line output from one of the multiple delay lines based at least in part on the converted signal.

20 Claims, 7 Drawing Sheets

DISTRIBUTED VOLTAGE AND TEMPERATURE COMPENSATION FOR CLOCK DESKEWING

TECHNICAL FIELD

The present disclosure relates to clocking architectures. In particular, it relates to using voltage and/or temperature compensated delay lines to balance skew between blocks of logic.

BACKGROUND

One of the metrics employed in designing a clocking architecture is skew (i.e., phase mismatch). A clocking architecture may suffer from process, voltage and temperature mismatch, even along identical paths.

Process variation is the naturally occurring variation in component attributes (e.g., length, width, oxide thickness) when integrated circuits are fabricated. The amount of process variation becomes pronounced at smaller process nodes as the variation becomes a larger percentage of the full length or width of the device. Process variation causes measurable and predictable variance in the output performance of all circuits due to mismatch. If the variance causes the measured or simulated performance of a particular output metric (bandwidth, gain, rise time, etc.) to fall below or to rise above the specification for the particular circuit or device, it reduces the overall yield for that set of devices.

Voltage and temperature gradients may cause timing variation in a chip. For example, thermal hot spots may be created in a system which in turn can increase in voltage drop. Similarly, the current flowing through the interconnections can generate heat, which in turn can affect the temperature gradients. Additionally, die temperature may not be uniform or consistent across different chips.

A clocking architecture may use a feedback-loop clock deskew (i.e., phase match) schemes to align clock phases at discontinuities in clock trees. One method of reducing clock skew is by using a closed loop feedback system where delay-locked loop (DLLs) and interfaces between the clock skew boundaries feed the DLLs different phases of the clocks at a given boundary. That information is then fed back to delay elements in order to match the delays at the inputs to the DLL. However, the problem with this technique is that the system requires a user mode clock to be continuously running to operate correctly. Any stoppage of the clock for purposes of clock gating, or switching over to another clock will cause the system to lose lock.

SUMMARY

An apparatus for clock deskew includes: a first delay element configured to receive a clock signal from a clock, wherein the delay element comprises multiple delay lines; a first multiplexer coupled to the multiple delay lines; a sensor configured to sense a voltage, a temperature, or both, and to provide a sensor output based at least on the sensed voltage and/or the sensed temperature; and a converter configured to receive the sensor output, and to generate a converted signal; wherein the first multiplexer is configured to provide a delay line output from one of the multiple delay lines based at least in part on the converted signal.

Optionally, the first multiplexer is configured to provide the delay line output that corresponds with an amount of delay incurred from a common clock node to the clock.

Optionally, the apparatus further includes: a phase detector configured to detect a difference in phase between a first clock region and a second clock region, and to output a phase detector feedback; a state machine configured to receive the phase detector feedback; and an adder configured to receive an output from the state machine and the converted signal, and to provide an adder output for reception by the first multiplexer.

Optionally, the phase detector is configured to iteratively detect the difference in phase between the first clock region and the second clock region, until a plurality of clock regions including the first clock region and the second clock region has a common phase within a specified tolerance.

Optionally, the apparatus further includes: a second delay element configured to receive the delay line output; and a second multiplexer coupled to the second delay element.

Optionally, the first delay element comprises a course delay element and the second delay element comprises a fine delay element.

Optionally, the apparatus further includes: a phase detector configured to detect a difference in phase between a first clock region and a second clock region, and to output a phase detector feedback; a state machine configured to receive the phase detector feedback; and an adder configured to receive an output from the state machine, and to provide an adder output for reception by the second multiplexer.

Optionally, the apparatus further includes a multiplier coupled between the converter and the first multiplexer, wherein the adder is configured to also receive an output from the multiplier.

Optionally, the apparatus further includes a phase detector configured to operate as a part of a closed loop system to compensate for process variation; wherein the sensor and the convertor are parts of an open loop system configured to compensate for time varying component of a clock system while the closed loop system is compensating for the process variation; wherein the closed loop system is configured to be turned off after the process variation is compensated; and wherein the open loop system is configured to continue to operate to compensate for the time varying component of the clock system after the closed loop system is turned off.

Optionally, the converter is configured to operate based on a translation table, the translation table comprising voltage values and/or temperature values.

Optionally, the first delay element comprises a variable delay element.

Optionally, the first delay element comprises a static delay element.

Optionally, the apparatus further includes additional sensors distributed in different respective regions in the apparatus, the additional sensors configured to provide respective sensor outputs for configuring respective delay tap settings for respective additional delay elements in the different respective regions.

An apparatus for clock deskew, includes: multiple delay elements configured to receive respective clock signals from a clock, wherein each of the multiple delay elements comprises multiple delay lines; multiple multiplexors respectively coupled to the multiple delay elements; multiple sensors distributed at different respective regions in the apparatus, each of the sensors configured to sense a voltage, a temperature, or both, and to provide a sensor output based at least on the sensed voltage and/or sensed temperature; and multiple converters configured to respectively receive the sensor outputs and to generate respective converted signals; wherein each of the multiplexors is configured to provide a delay line output from one of the multiple delay lines in the corresponding delay element based at least in part on the corresponding converted signal.

Optionally, the delay elements are configured to decrease delays to some of the regions with sensed voltages that are less than an average voltage and/or with sensed temperatures that are more than an average temperature, and to increase delays to some of the regions with sensed voltages that are greater than the average voltage and/or with sensed temperatures that are less than the average temperature.

Optionally, each of the multiplexors is configured to determine a delay tap setting that equalizes a delay with one or more adjacent ones of the multiplexors.

Optionally, the sensed voltage and/or the sensed temperature corresponds with a tap number.

Optionally, one of the delay elements comprises a coarse delay element configured to null out a nominal delay mismatch between at least two of the regions.

Optionally, the apparatus further includes: a translation table comprising voltage values, temperature values, or voltage-and-temperature values; and wherein one of the converters is configured to provide the converted signal based on one of the voltage values, one of the temperature values, or one of the voltage-and-temperature values in the translation table.

An apparatus for clock deskew includes: a closed loop system configured to deskew a non-time varying component of a clock system; and an open loop system configured to deskew a time varying component of the clock system, wherein the open loop system comprises a sensor configured to sense a voltage, a temperature, or both, and to provide a sensor output based at least on the sensed voltage and/or the sensed temperature, and a converter configured to receive the sensor output, and to generate a converted signal associated with a tap setting for a delay line; wherein the closed loop system is configured to deskew the non-time varying component before the open loop system operates to deskew the time varying component; and wherein the open loop system is configured to deskew the time varying component after the closed loop system is disengaged.

These and other features, aspects, embodiments, and advantages of the present disclosure will become better understood with regard to the following description, appended claims, and accompanying drawings.

BRIEF DESCRIPTION OF THE DRAWINGS

FIG. 1-2 illustrates a plurality of the apparatuses of FIG. 1-1.
FIG. 2-1 illustrates another apparatus for clock deskew.
FIG. 2-2 illustrates a method performed by the apparatus of FIG. 2-1.

DETAILED DESCRIPTION

Various examples are described hereinafter with reference to the figures. It should be noted that the figures are only intended to facilitate the description of the exemplary structures and methods. They are not intended as an exhaustive description of the claimed invention, or as a limitation on the scope of the claimed invention. In addition, an illustrated example needs not have all the aspects or advantages shown. An aspect or an advantage described in conjunction with a particular example is not necessarily limited to that example, and can be practiced in any other examples even if not so illustrated, or if not so explicitly described.

Embodiments of apparatus having an open loop deskew architecture and associated method for clock deskew are described herein. The apparatus compensates for voltage, temperature, and process variations by using a voltage and/or temperature sensor instead of a closed feedback loop. The sensor is configured to provide a sensor output for adjusting a delay associated with a delay element in order to compensate for clock skew. By configuring a delay element for a certain clock region, the clock region will equalize with one or more neighboring clock region(s) in terms of delay. In some cases, the apparatus may be a part of a system having multiple delay elements for compensating for clock skew. In such cases, the system may have multiple sensors at multiple locations (e.g., in a distributed manner) where respective delay elements are used to compensate for clock skew.

The open loop deskew architecture may be used in isolation, but may also be used with a feedback loop system. The feedback loop system allows all sources of clock phase error to be de-skewed using a configuration clock during initialization. When switching over to user mode (normal operation mode after initialization), the feedback system is disabled, but the voltage and/or temperature sensor continues to run for the open loop deskew system, so that any temperature and/or voltage gradient that develops over time is compensated without requiring a clock to run continuously. Thus, in some embodiments, the system will initially use the closed loop system to deskew non-time varying skew components (e.g., process mismatch that will not skew over time), and then continue using an open loop system to deskew time-varying components in order to allow clock stoppage. Accordingly, voltage and/or temperature compensation to deskew a clock network may be achieved without requiring a clock to run continuously.

Figure 1:
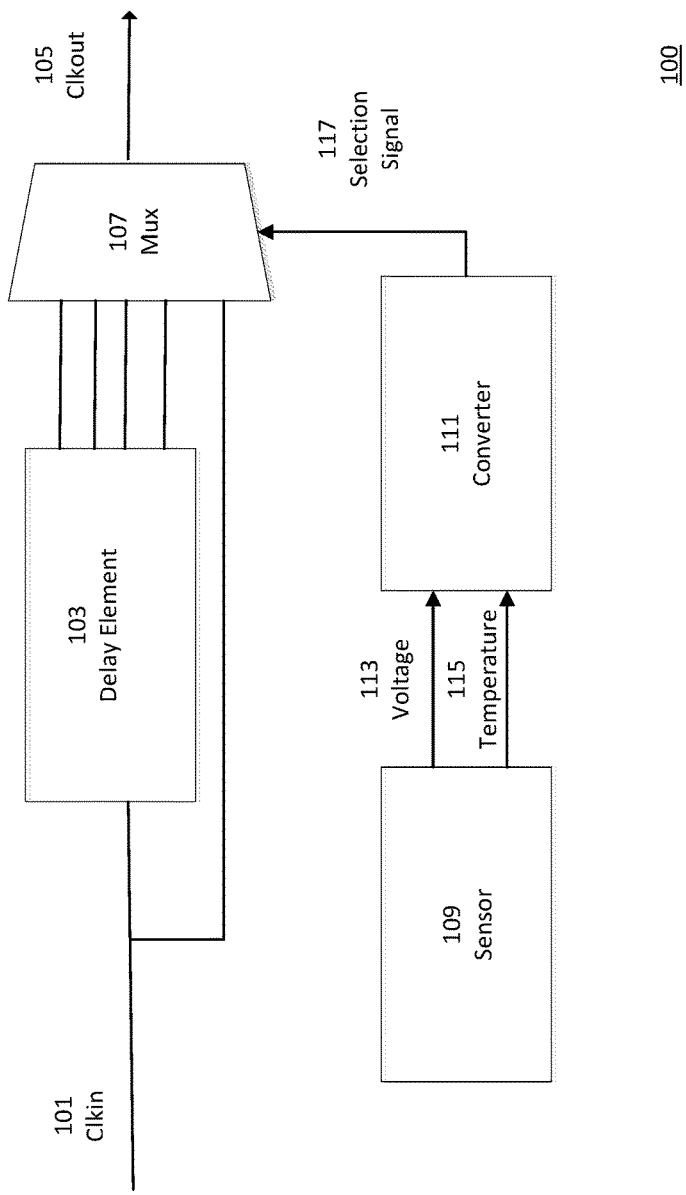
FIG. 1-1 illustrates an apparatus for clock deskew.

FIG. 1-1 illustrates an apparatus 100 for clock deskew. The apparatus 100 has an open loop clock deskew architecture. As shown in the figure, the apparatus 100 includes a first delay element 103 configured to receive a clock signal 101 from a clock, wherein the first delay element 103 comprises multiple delay lines. In some embodiments, the clock providing the signal 101 may be a configuration clock or a local clock. In some embodiments, the first delay element 103 may include a chain of inverters with memory cells for selection of one of the delay lines or tabs in the first delay element 103. In some embodiments, the first delay element 103 comprises a variable delay element. In other embodiments, the first delay element 103 comprises a static delay element. The first delay element 103 may have other configurations in other embodiments.

The apparatus 100 also includes a first multiplexer 107 coupled to the multiple delay lines of the first delay element 103. In some embodiments, the first multiplexer 107 has 256 taps, which means that 8 unique signals will be used to control the first multiplexer 107. In other embodiments, the first multiplexer 107 may have other number of taps. For example, the first multiplexer 107 may have fewer than 256 taps, in which case, fewer than 8 signals will be used to control the first multiplexer 107. As another example, the first multiplexer 107 may have more than 256 taps, in which case, more than 8 signals will be used to control the first multiplexer 107.

The apparatus 100 further includes a sensor 109 configured to sense one or more characteristics and to provide a sensor output representing the sensed characteristic(s). In particular, the sensor 109 is configured to sense a voltage, a temperature, or both, and to provide a sensor output 113, 115 based at least on the sensed voltage and/or the sensed temperature. In the example, sensor output 113 represents a sensed voltage, and sensor output 115 represents a sensed temperature. In other embodiments, the sensor 109 may provide one output value that may be coded to include both voltage and temperature information. Thus, as used in this specification, the term "sensor output" may refer to one or more values. In some embodiments, the sensor 109 may include a voltage sensing element and a temperature sensing element. The voltage sensing element may be any device configured to sense a characteristic that represents, or is associated with, a voltage in a semi-conductor device. The temperature sensing element may be any device configured to sense a characteristic that represents, or is associated with, a temperature in the semi-conductor device. Also, in some embodiments, instead of having both output 113, and output 115, the sensor 109 may provide only output 113 or only output 115.

In some embodiments, the sensor 109 may be configured to measure temperature and/or voltage of a die at a given location. In one implementation, the sensor 109 may be configured to measure temperature using a diode in a transistor layer. In other embodiments, the diode may be at other components. Also, in one implementation, the sensor 109 may be configured to measure voltage of one or more wires attached to a local power grid. In other embodiments, the voltage may be measured off from other components.

In another implementation, the sensor 109 may be an on-die analog-to-digital converter (ADC) whose input is muxed between a supply voltage and a Proportional To Absolute Temperature (PTAT) voltage—generated from the voltage difference between a pair of diodes. The output of the ADC is then de-multiplexed to present two digital words—one for the voltage measurement, and another for the temperature measurement.

The apparatus 100 also includes a converter 111 coupled to the sensor 109. The converter 111 is configured to receive the sensor output 113, 115, and to generate a converted signal 117. The converted signal 117 may represent a tap setting that is based on the sensor output 113, 115 (e.g., based on a conversion from such input). The converter 111 has an output configured to provide the converted signal 117 for reception by the first multiplexer 107. The first multiplexer 107 is configured to provide a delay line output 105 from one of the multiple delay lines of the first delay element 103 based at least in part on the converted signal. In some embodiments, the delay line output 105 is based on a selected tap setting (e.g., tap number) for adjusting an amount of delay traversing through the first multiplexer 107. In the illustrated embodiments, the converted signal 117 is based on the sensor output 113, 115. Thus, the sensor output 113, 115 indirectly controls an operation of the first multiplexer 107 through the converter 111.

In some embodiments, the converter 111 is configured to access a translation table (e.g., a lookup table) that associates a given voltage value, a given temperature value, or a combination of voltage and temperature values, with a corresponding delay tap setting (e.g., tap number). In particular, the translation table may be configured to inform the converter 111 a desired tap setting (e.g., how many delay taps are needed) to adjust a delay relative to the nearest common clock node. In other embodiments, in addition to voltage and/or temperature, the translation table may incorporate one or more other parameter(s) for association with a delay tap setting.

In some embodiments, the tap values in the translation table may determined by simulating effects of voltage variations, temperature variations, or both, on a delay line with a nominal delay. In some cases, the nominal delay may be 10 nanoseconds. However, the nominal delay may be any number, and may be more or less than 10 nanoseconds. In some embodiments, for each voltage value, each temperature, or each voltage-and-temperature combination, a simulation may be run to determine a delay tap setting (e.g., tap number) that is needed to compensate for a variation on the delay. The tap numbers are then stored in the translation table in association with its corresponding voltage value, temperature value, or voltage-and-temperature combination.

In some embodiments, the translation table may be stored in a non-transitory medium. For example, the translation table may be stored in a ROM, a RAM, or any of other types of memory or storage device. The non-transitory medium may be a part of the converter 111, outside the converter 111 but within the apparatus 100, or outside the apparatus 100. In other embodiments, instead of the translation table, the apparatus 100 may utilize other types of data structure.

In the illustrated embodiments, the converter 111 is configured to provide a converted signal representing a desired delay tap setting in order to adjust a delay. The converted signal is received by the first multiplexer 107, which is configured to output a delay line output 105 based on the converted signal. For example, the delay line output 105 may be a signal from one of the delay lines in the first delay element 103 that corresponds with the desired tap setting (e.g., tap number).

For example, assuming there is a delay element that has a nominal delay of 10 nanoseconds. If there is a variance (e.g., drop) in voltage, then the delay element may provide a delay of 13 nanoseconds due to the voltage variance. In order to compensate for the voltage drop, the translation table may inform the converter 111 that the $8^{th}$ tap need to be selected to adjust the delay of 13 nanoseconds so that the adjusted delay will be closer to 10 nanoseconds (i.e., the delay needs to be speed up by 3 nanoseconds). The converter 111 then outputs a converted signal representing a desired tap setting (e.g., the $8^{th}$ tap in the example).

In some embodiments, the first multiplexer 107 is configured to provide the delay line output 105 that corresponds with an amount of delay incurred from a common clock node to the clock. This configuration is advantageous because if every local clock driven from the same nearest common node has a similar scheme, then any voltage and/or temperature gradient will be compensated out so that the delay from source to each node will be substantially identical.

Figures 1, 2:
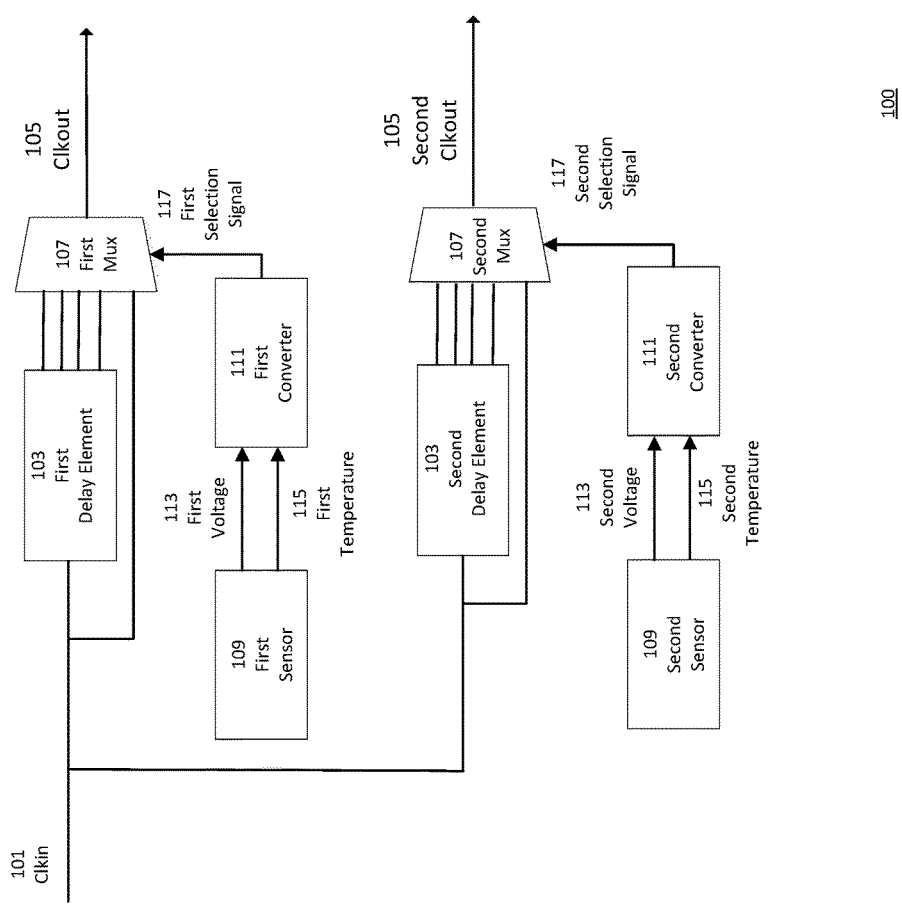
Figures 1, 2:
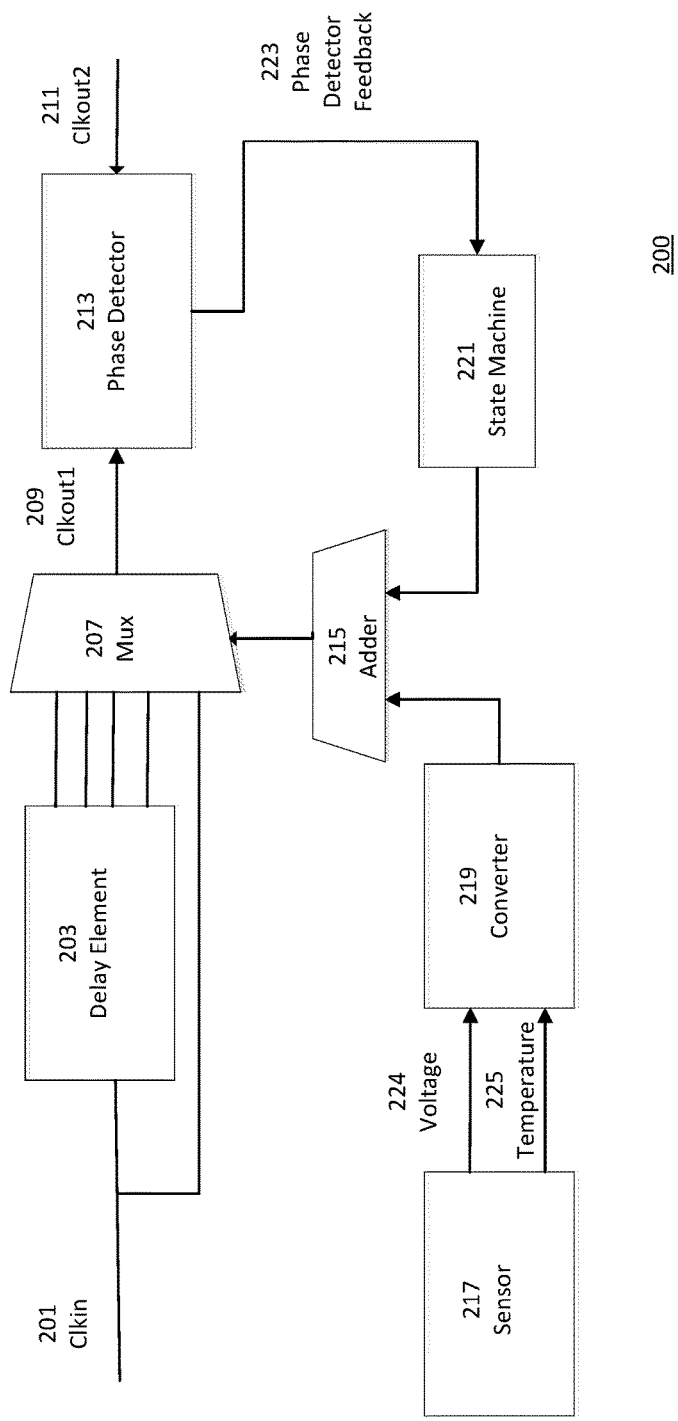
Figure 2:
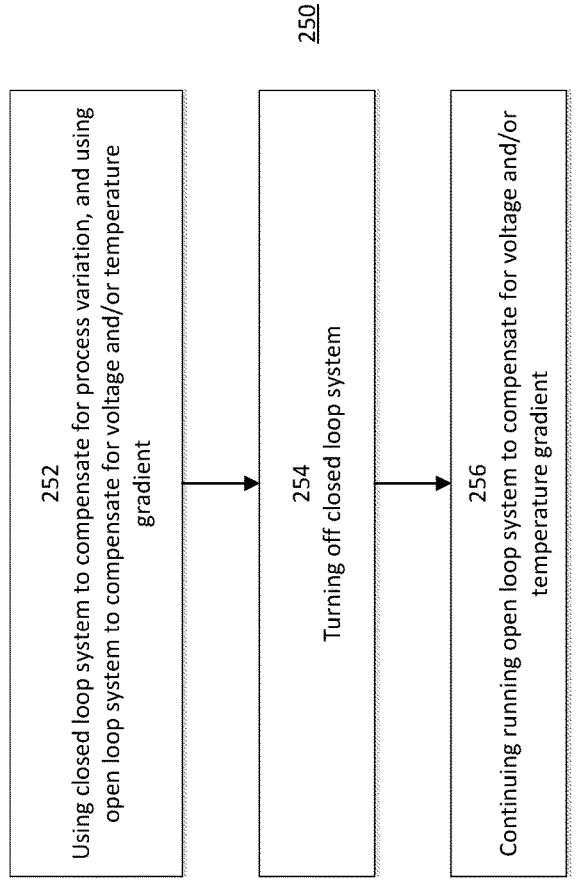

As shown in FIG. 1-2, in some embodiments, the apparatus of FIG. 1-1 may be a part of an apparatus that includes multiple respective sensors 109 distributed at different regions. In such cases, the delay lines are programmed in a way that equalizes delay to all loads by decreasing delays to locations with less than average voltages and/or with more than average temperatures, and by increasing delays in locations with greater than average voltages and/or with less than average temperatures. A given voltage-temperature combination provided by the sensor yields a fixed delay tap setting. Each location (where there is a sensor 109) senses voltage and temperature, and picks its own delay tap setting that equalizes delay with neighboring locations (which have different respective voltage-temperature combinations).

In particular, as shown in FIG. 1-2, the apparatus 100 includes: multiple delay elements 103 configured to receive respective clock signals 101 from a clock, wherein each of the multiple delay elements 103 comprises multiple delay lines. The apparatus 100 also includes multiple multiplexors 107 respectively coupled to the multiple delay elements 103. The apparatus 100 further includes multiple sensors 109 distributed at different respective regions in the apparatus 100, each of the sensors 109 configured to sense a voltage, a temperature, or both, and to provide a sensor output based at least on the sensed voltage and/or sensed temperature. In some cases, the sensed voltage and/or the sensed temperature may correspond with a tap number. The apparatus 100 also includes multiple converters 111 configured to respectively receive the sensor outputs and to generate respective converted signals. Each of the multiplexors 107 is configured to provide a delay line output from one of the multiple delay lines in the corresponding delay element 103 based at least in part on the corresponding converted signal. In some cases, the delay elements 103 are configured to decrease delays to some of the regions with sensed voltages that are less than an average voltage and/or with sensed temperatures that are more than an average temperature, and to increase delays to some of the regions with sensed voltages that are greater than the average voltage and/or with sensed temperatures that are less than the average temperature. In some embodiments, at least one of the delay elements 103 comprises a coarse delay element configured to null out a nominal delay mismatch between at least two of the regions. Also, in some embodiments, each of the multiplexors 107 is configured to determine a delay tap setting that equalizes a delay with one or more adjacent ones of the multiplexors 107. In some embodiments, the apparatus 100 may further include a translation table comprising voltage values, temperature values, or voltage-and-temperature values, wherein one of the converters 111 is configured to provide the converted signal based on one of the voltage values, one of the temperature values, or one of the voltage-and-temperature values in the translation table. Although two sensors 109 are shown distributed in two regions in the apparatus 100, in other embodiments, the apparatus 100 may include more than two regions with respective sensors 109.

The apparatus 100 of FIG. 1-1/1-2 may be used in a system in which the clock paths are nominally matched from a process variation standpoint. Two clock skews that are nominally balanced may still result in a clock skew between those two clock paths due to voltage and/or temperature change at different points in the die over time. Thus, the apparatus 100 is advantageous because it addresses such voltage and/or temperature variations.

In other embodiments, a clock network may encounter process variation that causes skew even in nominally balanced paths. In such cases, the apparatus 100 still compensates for voltage and/or temperature gradients, but it may be desirable to couple the apparatus 100 to a component that compensates for process variation.

FIG. 2-1 illustrates an apparatus 200 for clock deskew, wherein the apparatus 200 includes a component for compensating for process variation. The apparatus 200 includes an open loop deskew system (like that shown in FIG. 1-1) coupled with a closed feedback loop system that compensates for process variation. As shown in the figure, the apparatus 200 includes a first delay element 203 configured to receive a clock signal 201 from a clock, wherein the first delay element 203 comprises multiple delay lines.

In particular, the open loop deskew system in the apparatus 200 includes a first delay element 203, a first multiplexer 207, a voltage and/or temperature sensor 217, and a converter 219. The first delay element 203 and the first multiplexer 207 are the same or similar to the first delay element 103 and the first multiplexer 107 of FIG. 1-1. Thus, the details of these components will not be repeated herein.

The sensor 217 and the converter 219 in the apparatus 200 are the same or similar to the sensor 109 and the converter 111 of FIG. 1-1. In particular, the sensor 217 is configured to sense one or more characteristics and to provide a sensor output representing the sensed characteristic(s). In one implementation, the sensor 217 is configured to sense a voltage, a temperature, or both, and to provide a sensor output 224, 225 based at least on the sensed voltage and/or the sensed temperature. In the example, sensor output 224 represents a sensed voltage, and sensor output 225 represents a sensed temperature. In other embodiments, the sensor 217 may provide one output value that may be coded to include both voltage and temperature information. In some embodiments, the sensor 217 may include a voltage sensing element and a temperature sensing element. The voltage sensing element may be any device configured to sense a characteristic that represents, or is associated with, a voltage in a semi-conductor device. The temperature sensing element may be any device configured to sense a characteristic that represents, or is associated with, a temperature in the semi-conductor device.

The converter 219 in the open loop system of the apparatus 200 is coupled to the sensor 217. The converter 219 is configured to receive the sensor output 224, 225, and to generate a converted signal. The converter 219 has an output configured to provide the converted signal for reception by an adder 215. The first multiplexer 207 is configured to provide a delay line output (clock signal) 209 from one of the multiple delay lines of the first delay element 203 based at least in part on an output from the adder 215. In some embodiments, the delay line output 209 is based on a selected tap setting (e.g., tap number) for adjusting an amount of delay traversing through the first multiplexer 207. In the illustrated embodiments, the converted signal from the converter 219 is based on the sensor output 224, 225. Thus, the sensor output 224, 225 indirectly controls an operation of the first multiplexer 207 through the converter 219.

In some embodiments, the converter 219 is configured to access a translation table (e.g., a lookup table) that associates a given voltage value, a given temperature value, or a combination of voltage and temperature values, with a corresponding delay tap setting (e.g., tap number). In particular, the translation table may be configured to inform the converter 219 a desired tap setting (e.g., how many delay taps are needed) to adjust a delay relative to the nearest common clock node. In other embodiments, in addition to voltage and/or temperature, the translation table may incorporate one or more other parameter(s) for association with a delay tap setting.

The closed loop system in the apparatus 200 includes a phase detector 213 coupled to an output side of the first multiplexer 207. The phase detector 213 is configured to receive a first signal (the delay line output) 209 from the first multiplexer 207, wherein the first signal 209 is associated with a first clock region. The phase detector 213 is also configured to receive a second signal 211 associated with a second clock region. In some cases, the first signal and the second signal may be first clock signal and second clock signal. The phase detector 213 is further configured to determine a phase difference between the first signal and the second signal, and output a phase detector feedback 223.

The closed loop system in the apparatus 200 also includes a state machine 221 configured to receive the phase detector feedback 223. The phase detector 213 and the state machine 221 in the closed loop system operate together to compensate for process variation or non-varying time components. As discussed, the phase detector 213 is configured to detect a difference in phase between a first clock region (e.g., the clock region to its left) and a second clock region (e.g., the clock region to its right), and to output the phase detector feedback 233. Based on the phase detector feedback 233, the state machine 221 is configured to provide a state machine output (transmitted via the adder 215) to operate the first multiplexer 207 so that the signal 209 and the signal 211 will match in phase at the phase detector 213, thereby equalizing delays between the adjacent clock regions The state machine 221 is configured to convert a series of binary speed up/slow down signals (the phase detector feedback 223) from the phase detector 213 to a delay tap setting. In one implementation, it can be as simple as an up/down counter. The adder 215 is configured to add a delay tap setting (derived from the output 224, 225 of the sensor 217, and provided by the converter 219) and a delay tap setting output from the state machine 221. For instance, the output from the state machine 221 may indicate that 5 units (e.g., 5 taps) of delay are required to match a neighboring clock region, and the output from the converter 219 may indicate that 3 units of delay are required for a given voltage and temperature combination. In such example, the combined delay output by the adder 215 would be 8 taps. In some embodiments, a tap may correspond to a duration of 1 picosecond or less (e.g., a fraction of 1 picosecond). In other embodiments, a tap may correspond to other durations (e.g., a duration of more than 1 picosecond).

In some embodiments, the closed loop system is configured to run continuously. Also, in some embodiments, the closed loop system is configured to operate during an initialization or startup process to compensate for process variation or non-varying time components. After the initialization is completed, the closed loop system is then disabled. In other embodiments, the closed loop system may be configured to operate even after the initialization or startup process. For example, the closed loop system may operation during a user mode (normal operation mode) of the apparatus 200.

As shown in the figure, the adder 215 is coupled to the state machine 221 and the converter 219 to provide the adder output for reception by the first multiplexer 207. As explained above, the first multiplexer 207 is configured to provide a delay line output from one of the multiple delay lines in the first delay element 203 based at least in part on the adder output from the adder 215. Since the adder output from the adder 215 is in turn based on the converted output from the converter 219, the first multiplexer 207 provides the delay line output 209 based (indirectly) on the converted signal from the converter 219. In some embodiments, the delay line output 209 selected corresponds with the amount of delay incurred from a common clock node to the local clock. As such, if every local clock driven from the same nearest common node has a similar scheme, then any voltage and/or temperature gradient will be compensated out so that the delay from source to each leaf node will be substantially identical.

In the apparatus 200, the open loop system and the closed loop system are configured to compensate for voltage, temperature and process variation. The closed loop system compensates for process variation or non-time varying components while the open loop system compensates for voltage and/or temperature variations. This way all sources of clock phase error can be deskewed using a configuration clock. In some embodiments, the open loop system and the closed loop system are both on simultaneously at time zero. In some embodiments, the open loop system is always on, and the closed loop system can be turned on and off.

Referring to the method 250 of FIG. 2-2, during use of the apparatus 200, the closed loop system uses the phase detector feedback 223 from the phase detector 213 to equalize delays between adjacent clock regions (which respectively provide clock signal 209 and clock signal 211) to compensate for process variation, and the open loop system is also run to compensate for voltage and/or temperature gradient (item 252). In particular, with respect to process variation compensation, phases of the adjacent clock regions are sampled with the phase detector 213, which determine a phase difference between the adjacent clock regions. The state machine 221 then uses such information to provide an output for the adder 215, so that the adder 215 can provide its adder output to operate the first multiplexer 207 in order to equalize delays between the adjacent clock regions. After the delays between adjacent clock regions have been equalized to compensate for process variation, the closed loop system is then disabled (item 254). When this happens, the phase detector information is "frozen" such that the output from the state machine 221 does not change, but the voltage and/or temperature sensor 217 continues to operate in the open loop system to compensate for voltage and/or temperature gradients (item 256). This configuration has the benefit of not requiring a continuously running clock.

In some embodiments, the phase detector 213 is configured to iteratively detect a difference in phase between a first clock region (e.g., the clock region to its left in the figure) and a second clock region (e.g., the clock region to its right in the figure), until a plurality of clock regions including the first clock region and the second clock region has a common phase within a specified tolerance.

The operation of the open loop system in the apparatus 200 is similar to that described with reference to the apparatus 100 in FIG. 1-1, and therefore, the details of such will not be repeated herein.

Figure 3:
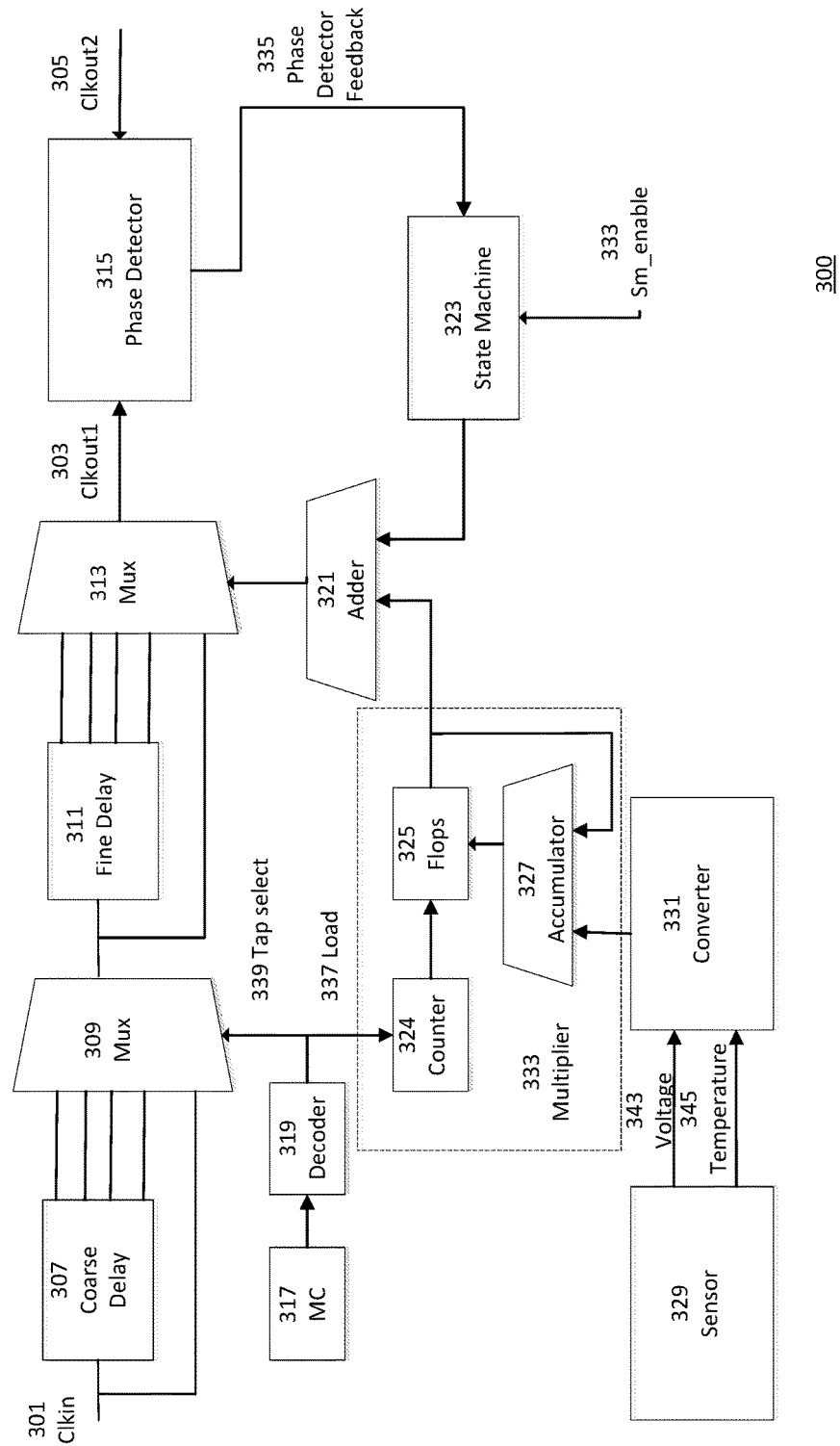
FIG. 3 illustrates another apparatus for clock deskew.

FIG. 3 illustrates another apparatus 300 for clock deskew, wherein the apparatus 300 also includes a component for compensating for process variation. In particular, the apparatus 300 includes a closed feedback loop system (like that shown in the apparatus 200 of FIG. 2-1) that compensates for process variation.

As shown in the figure, the open loop system in the apparatus 300 includes a first delay element 307, a first multiplexer 309, a second delay element 311, a second multiplexer 313, a voltage and/or temperature sensor 329, a converter 331, and a multiplier 333. The first delay element 307 is configured to receive a clock signal 301 from a clock. In the illustrated embodiments, the first delay element 307 is a coarse delay element, and the second delay element 311 is a fine delay element. The first (coarse) delay element 307 is configured to null out any nominal delay mismatch between clock regions. The second (fine) delay element 311 is configured to fine tune the delay. The sensor 329 is configured to sense a voltage and/or a temperature associated with a clock region, and provide sensor output 343, 345 representing the sensed voltage and/or sensed temperature. The sensor output 343, 345 is received by the converter 331, which is configured to provide a converted signal (e.g., tap setting) to the multiplier 333. The multiplier 333 in turn provides its output for controlling the first multiplexer 309 for coarse delay adjustment. The converter 331 also provides its converted signal to the adder 321, which in turn provides its adder output to control the second multiplexer 313 for fine delay adjustment.

The closed loop system in the apparatus 300 includes a phase detector 315 coupled to an output side of the second multiplexer 313. The phase detector 315 is configured to receive a first signal (the delay line output) 303 from the second multiplexer 313, wherein the first signal 303 is associated with a first clock region. The phase detector 315 is also configured to receive a second signal 305 associated with a second clock region. In some cases, the first signal and the second signal may be first clock signal and second clock signal. The phase detector 315 is further configured to determine a phase difference between the first signal and the second signal, and output a phase detector feedback 335.

The closed loop system in the apparatus 300 also includes a state machine 323 configured to receive the phase detector feedback 335. The phase detector 315 and the state machine 323 in the closed loop system operate together to compensate for process variation or non-varying time components. As discussed, the phase detector 315 is configured to detect a difference in phase between a first clock region (e.g., the clock region to its left) and a second clock region (e.g., the clock region to its right), and to output the phase detector feedback 335. Based on the phase detector feedback 335, the state machine 323 is configured to provide a state machine output (transmitted via the adder 321) to operate the second multiplexer 313 so that the first signal 303 and the second signal 305 will match in phase at the phase detector 315, thereby equalizing delays between the adjacent clock regions As similarly discussed with reference to the embodiment of FIG. 2-1, in the apparatus 300 of FIG. 3 uses an open loop system and a closed loop system to compensate for voltage, temperature and process variation. The closed loop system compensates for process variation or non-time varying components while the open loop system compensates for voltage and/or temperature variations. This way all sources of clock phase error can be deskewed using a configuration clock.

Also, as similarly discussed, the delays between adjacent clock regions due to non-time varying components may be equalized by running the closed loop system during an initialization/startup process. After that is completed, the closed loop system is then disabled. When this happens, the phase detector information is "frozen" such that the output from the state machine 323 does not change, but the voltage and/or temperature sensor 329 continues to operate in the open loop system to compensate for voltage and/or temperature gradients. This configuration has the benefit of not requiring a continuously running clock. In some embodiments, the state machine 323 may be enabled or disabled via a control signal 333.

The apparatus 300 of FIG. 3 involves a clock network that has added complexity of a clock tree that is not nominally matched because one portion of the clock tree is nominally longer than the other. In the illustrated embodiments, the first (coarse) delay element 307 is configured to compensate for a nominal mismatch. Once the first (coarse) delay element 307 compensates for that nominal mismatch, the second (fine) delay element 313 is then used in the closed loop system for process mismatch. After the process mismatch, the voltage and/or temperature sensor 329 and the converter 331 is used for voltage and/or temperature mismatch.

In the illustrated embodiments, a delay tap selection for the first (coarse) delay element 307 is programmed via memory cell(s) 317 and a decoder 319 to null out any nominal delay mismatches between neighboring clock regions. This makes the system more complicated because the voltage and temperature delay table adjustments assume a single base delay, but the delay output by the first (coarse) delay element 307 may vary by location on the die (e.g., closer to the root causes a longer delay, and further from the root causes a shorter delay).

One technical solution is to multiply the tap setting offset by the number of delay taps used. An iterative multiplier 333 may be used to save area since the response time of the system is in many cycles. As shown in the figure, the multiplier 333 includes a counter 324, flops 325, and an accumulator 327. In some embodiments, a parallel multiplier may be used. The counter 324, the flops 325, and the accumulator 327 operate with each other so that the iterative multiplier 333 provides the function of adding the same number to itself N times. For example, if the tap setting based on sensor output from the sensor 329 is 5 units (e.g., 5 taps), and assuming the coarse delay is 3 units, then the multiplier 333 adds the value 5 to itself 3 times to provide a tap number of 15.

An alternative to the multipler 333 is to modify the contents of a look-up table in the converter 331 to magnify (e.g., multiply) the output word for a given voltage and temperature combination. This magnification may be scaled appropriately based on the particular application.

At configuration time, the first (coarse) delay element 307 may be programmed using the memory cell(s) 317 and the decoder 319. After this, the closed loop system in the apparatus 300 uses the phase detector 315 to modify the second (fine) delay element 311, which is a time variant. The second (fine) delay element 311 performs a fine tuning because the first (coarse) delay element 307 is not as accurate. After the closed loop system is run to deskew out the non-time varying process related skew, the clock paths are nominally matched, and the closed loop system is then turned off via the control signal 333. When the closed loop system is turned off, the open loop system in the apparatus 300 will continuously operate to deskew time varying voltage and/or temperature gradients.

In some cases, the voltage and/or temperature variation is proportional to the size of the delay element that is being used. As an example, assuming the apparatus 300 has a coarse delay element of 10 units (e.g., 10 taps), and the voltage and/or temperature variation may be causing a 20% increase in delay. In this example, the apparatus 300 may multiply the delay by that factor. Thus, for the apparatus 300 using a coarse delay element of 10 units, then 2 delay taps are added. As another example, assuming the apparatus 300 is using a coarse delay element of 5 units, then only 1 delay tap is added. In one embodiment, the multiplier 333 increases or decreases the number of taps proportionally to the size of the first (coarse) delay element 307 that the system is using.

As an example, if the apparatus 300 selects 3 taps using the select signal 339 for the first (coarse) delay element 307, then the counter 324 gets loaded with the value 3 via the load signal 337, and the accumulator 327 will execute 3 times. This means that the second (fine) delay element 311 is compensating for 3 coarse delays and not just 1 coarse delay. The coarse delay can have different delay amounts such that in a small clock domain, the system may not need a coarse delay, whereas in a large clock domain the system may need a coarse delay (e.g., 10 taps, etc.).

In other embodiments, instead of using the multiplier 333, the converter may use a translation table having entry for every possible coarse delay line length.

Figure 4:
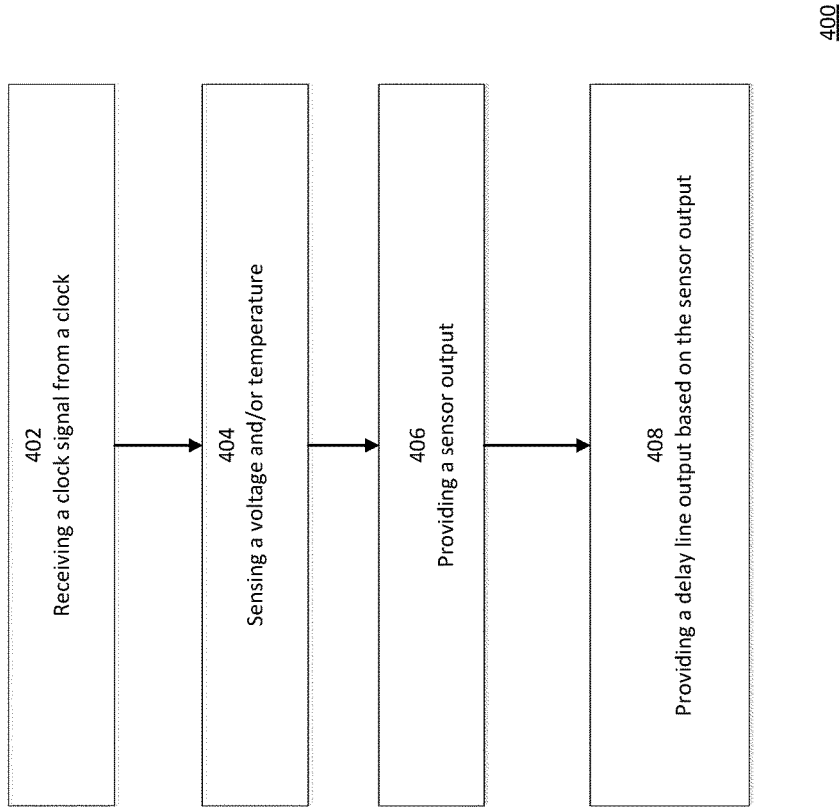
FIG. 4 illustrates a method for clock deskew.

FIG. 4 illustrates a method 400 for clock deskew. At the start of the method 400, a clock signal is received at a delay element that comprises multiple delay lines (item 402). In some embodiments, item 402 may be performed by the first delay element 103, 203, or 307 in FIG. 1-1, 2, or 3, or the second delay element 313 in FIG. 3.

Returning to FIG. 4, next, a sensor is used to sense a voltage and/or a temperature (item 404), and the sensor then provides a sensor output based at least on the sensed voltage and/or sensed temperature (item 406). The sensor output may represent the sensed voltage and/or the sensed temperature. In some embodiments, item 404 and item 406 may be performed by the sensor 109, 217, or 329 in FIG. 1-1, 2, or 3.

Next, a delay line output from one of the multiple delay lines is provided by a multiplexer based (directly or indirectly) at least in part on the sensor output (item 408). In some embodiments, the multiplexer 107, 207, or 309 in FIG. 1-1, 2, or 3 may be used to perform item 408. In some cases, the delay line output corresponds with an amount of delay incurred from a common clock node to the clock.

Also, in some embodiments, the method 400 further includes using the sensed voltage and/or the sensed temperature to determine a delay tap number. In one implementation, a converter may access a translation table comprising voltage values, temperature values, or a combination of voltage-and-temperature values. For each voltage, each temperature, or each voltage-and-temperature combination, the translation table provides a corresponding tap setting (e.g., tap number). The converter may then provide a converted signal based on one of the voltage values, one of the temperature values, or one of the voltage-and-temperature values in the translation table, with the converted signal representing the tap setting (e.g., tap number) obtained from the translation table. The converted signal may then be used, either directly or indirectly, to operate a multiplexer so that it outputs a signal from a certain one of the delay lines in a delay element. The converter may be the converter 111, 219, 331 in FIG. 1-1, 2, or 3. Also, the multiplexer may be the multiplexer 107, 207, 309, or 313 in FIG. 1-1, 2, or 3.

In other embodiments, instead of the translation table, other types of data structure may be used.

In some embodiments, the items 402, 404, 406, 408 in the method 400 may be performed while running an open loop system to deskew a time-varying component. The open loop system is advantageous in that it allows deskewing of time-varying components (e.g., time varying voltage and/or temperature gradients) with requiring a continuously running clock.

Also, in some embodiments, the method 400 may further include: running a closed loop system to deskew a non-time varying component. The closed loop system may involve a phase detector that is coupled to the delay element. For example, the closed loop system may be implemented using the phase detector 213, the state machine 221, and the adder 215 of FIG. 2-1. As another example, the closed loop system may be implemented using the phase detector 315, the state machine 323, and the adder 321 of FIG. 3. The closed loop system allows all sources of clock phase error to be deskewed using a configuration clock during initialization. When switching over to user mode (normal operation mode after initialization), the feedback system is disabled, but the voltage and/or temperature sensor continue to run for the open loop deskew system, so that any temperature or voltage gradient that develops over time is compensated without requiring a clock to run continuously. Thus, in some embodiments, the system will initially use the closed loop system to deskew non-time varying skew components (e.g., process mismatch that will not skew over time), and then continue using an open loop system to deskew time-varying components in order to allow clock stoppage. Accordingly, voltage and/or temperature compensation to deskew a clock network may be achieved without requiring a clock to run continuously.

In some embodiments, the method 400 further includes detecting, using a phase detector (such as the phase detector 213 in FIG. 2-1, or the phase detector 315 in FIG. 3), a difference in phase between a first clock region and a second clock region. The method 400 may also include determining an amount of phase delay to be applied based at least in part on the difference in phase, and applying, using a delay element, the amount of phase delay for the first clock region.

In some cases, a system may include multiple apparatuses 100, multiple apparatuses 200, or multiple apparatuses 300. In such cases, the system may include multiple phase detectors for different respective clock regions. The method 400 may include using the phase detectors to deskew out non-time process related skews in the system. Also, in such system, there will be multiple sensors 109/217/329 distributed in the corresponding clock regions. Accordingly, the method 400 may include running multiple open loop system to deskew time varying components.

Optionally, the method 400 may further include using a coarse delay line to null out a nominal delay mismatch between clock regions. The course delay line may be implemented using the delay element, or another delay element.

In one or more embodiments descried herein, soft logic and/or field-programmable gate array (FPGA) elements may be used to build or implement any portion of the apparatus 100, 200, or 300. For example, in some embodiments, soft logic may be employed to implement the multiplier 333, the adder 215/321, and/or the converter 111/219/331. In another embodiment, any or the entire portion of the apparatus 100, 200, or 300 may be implemented via an FPGA.

Where the method 400 described above indicate certain events occurring in certain order, those of ordinary skill in the art having the benefit of this disclosure would recognize that the ordering may be different in different embodiments. Additionally, parts of the methods may be performed concurrently in a parallel process when possible, or sequentially. In addition, more parts or less part of the method 400 may be performed.

Figure 5:
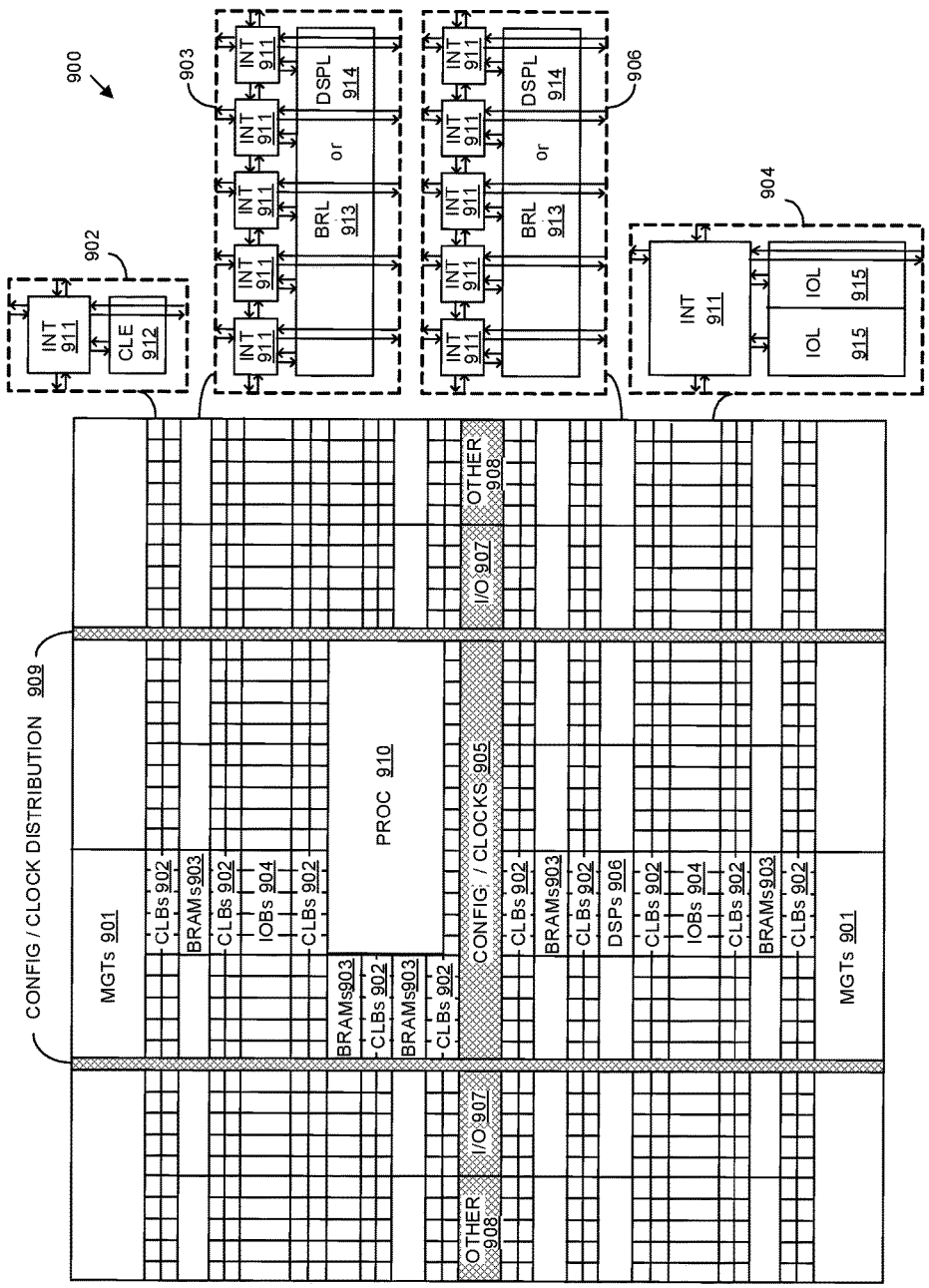
FIG. 5 is a block diagram illustrating an exemplary architecture of an integrated circuit.

FIG. 5 is a block diagram illustrating an exemplary architecture 900 for an IC, which may implement/embody the apparatus 100, 200, 300, or any component thereof. In one aspect, architecture 900 is implemented within a field programmable gate array (FPGA) type of IC. As shown, architecture 900 includes several different types of programmable circuit, e.g., logic, blocks. For example, architecture 900 can include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the top of FIG. 5.

For example, a CLB 902 can include a configurable logic element (CLE) 912 that can be programmed to implement user logic plus a single INT 911. A BRAM 903 can include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also can be used. A DSP tile 906 can include a DSP logic element (DSPL) 914 in addition to an appropriate number of INTs 911. An 10B 904 can include, for example, two instances of an I/O logic element (IOL) 915 in addition to one instance of an INT 911. As will be clear to those of skill in the art, the actual I/O pads connected, for example, to IOL 915 typically are not confined to the area of IOL 915.

In the example pictured in FIG. 5, a columnar area near the center of the die, e.g., formed of regions 905, 907, and 908, can be used for configuration, clock, and other control logic. Horizontal areas 909 extending from this column are used to distribute the clocks and configuration signals across the breadth of the programmable IC.

Some ICs utilizing the architecture illustrated in FIG. 5 include additional logic blocks that disrupt the regular columnar structure making up a large part of the IC. The additional logic blocks can be programmable blocks and/or dedicated circuitry. For example, a processor block depicted as PROC 910 spans several columns of CLBs and BRAMs.

In one aspect, PROC 910 is implemented as a dedicated circuitry, e.g., as a hard-wired processor, that is fabricated as part of the die that implements the programmable circuitry of the IC. PROC 910 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 is omitted from architecture 900 and replaced with one or more of the other varieties of the programmable blocks described. Further, such blocks can be utilized to form a "soft processor" in that the various blocks of programmable circuitry can be used to form a processor that can execute program code as is the case with PROC 910.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 5 that are external to PROC 910 such as CLBs 903 and BRAMs 903 can be considered programmable circuitry of the IC.

In general, the functionality and connectivity of programmable circuitry are not established until configuration data is loaded into the IC. A set of configuration bits can be used to program programmable circuitry of an IC such as an FPGA. The configuration bit(s) typically is referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 5 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 5 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 910 within the IC are for purposes of illustration only and are not intended as a limitation.

In other cases, the various features described herein may be implemented in any integrated circuit, such as a general purpose processor, a microprocessor, an ASIC, or any other types of processors, which may or may not be a FPGA.

Although particular examples have been shown and described, it will be understood that it is not intended to limit the claimed inventions to the preferred examples, and it will be obvious to those skilled in the art that various changes and modifications may be made without exceeding the scope of the claimed invention. The specification and drawings are, accordingly, to be regarded in an illustrative rather than restrictive sense. The claimed inventions are intended to cover alternatives, modifications, and equivalents.

What is claimed is:

1. An apparatus comprising:
   a first delay element configured to receive a clock signal from a clock, wherein the first delay element comprises multiple delay lines;
   a first multiplexer coupled to the multiple delay lines;
   a sensor configured to sense a voltage, a temperature, or both, and to provide a sensor output based at least on the sensed voltage and/or the sensed temperature;
   a converter configured to receive the sensor output, and to generate a converted signal, wherein the first multiplexer is configured to provide a delay line output from one of the multiple delay lines based at least in part on the converted signal;
   a phase detector configured to detect a difference in phase between a first clock region and a second clock region, and to output a phase detector feedback;
   a state machine configured to receive the phase detector feedback; and
   an adder configured to receive an output from the state machine and the converted signal, and to provide an adder output for reception by the first multiplexer.

2. The apparatus of claim 1, wherein the first multiplexer is configured to provide the delay line output that corresponds with an amount of delay incurred from a common clock node to the clock.

3. The apparatus of claim 1, wherein the phase detector is configured to iteratively detect the difference in phase between the first clock region and the second clock region, until a plurality of clock regions including the first clock region and the second clock region has a common phase within a specified tolerance.

4. The apparatus of claim 1, wherein the converter is configured to operate based on a translation table, the translation table comprising voltage values and/or temperature values.

5. The apparatus of claim 1, further comprising additional sensors distributed in different respective regions in the apparatus, the additional sensors configured to provide respective sensor outputs for configuring respective delay tap settings for respective additional delay elements in the different respective regions.

6. The apparatus of claim 1, wherein the sensed voltage and/or the sensed temperature corresponds with a tap number.

7. The apparatus of claim 1, wherein the phase detector is a part of a closed loop system;
wherein the sensor and the converter are parts of an open loop system;
wherein the closed loop system is configured to compensate for a first type of process variation; and
wherein the open loop system is configured to compensate for a second type of process variation.

8. The apparatus of claim 1, wherein the phase detector is a part of a closed loop system;
wherein the sensor and the converter are parts of an open loop system;
wherein the closed loop system is configured to deskew a non-time varying component of a clock system; and
wherein the open loop system is configured to deskew a time varying component of the clock system.

9. The apparatus of claim 8, wherein the closed loop system is configured to deskew the non-time varying component before the open loop system deskews the time varying component.

10. The apparatus of claim 8, wherein the closed loop system is configured to be turned off after the non-time varying component is deskewed; and
wherein the open loop system is configured to continue to operate after the closed loop system is turned off.

11. An apparatus comprising:
a first delay element configured to receive a clock signal from a clock, wherein the first delay element comprises multiple delay lines;
a first multiplexer coupled to the multiple delay lines, wherein the first multiplexer is configured to provide a delay line output from one of the multiple delay lines;
a sensor configured to sense a voltage, a temperature, or both, and to provide a sensor output based at least on the sensed voltage and/or the sensed temperature;
a converter configured to receive the sensor output, and to generate a converted signal;
a second delay element configured to receive the delay line output; and
a second multiplexer coupled to the second delay element and configured to select an output of the second delay element based at least in part on the converted signal.

12. The apparatus of claim 11, wherein the first delay element comprises a course delay element and the second delay element comprises a fine delay element.

13. The apparatus of claim 11, further comprising:
a phase detector configured to detect a difference in phase between a first clock region and a second clock region, and to output a phase detector feedback;
a state machine configured to receive the phase detector feedback; and
an adder configured to receive an output from the state machine, and to provide an adder output for reception by the second multiplexer.

14. The apparatus of claim 13, further comprising a multiplier coupled between the converter and the first multiplexer, wherein the adder is configured to also receive an output from the multiplier.

15. The apparatus of claim 11, further comprising a phase detector configured to operate as a part of a closed loop system;
wherein the sensor and the converter are parts of an open loop system;
wherein the closed loop system is configured to deskew a non-time varying component of a clock system; and
wherein the open loop system is configured to deskew a time varying component of the clock system.

16. The apparatus of claim 15, wherein the closed loop system is configured to deskew the non-time varying component before the open loop system deskews the time varying component.

17. The apparatus of claim 15, wherein the closed loop system is configured to be turned off after the non-time varying component is deskewed; and
wherein the open loop system is configured to continue to operate after the closed loop system is turned off.

18. The apparatus of claim 11, further comprising additional sensors distributed in different respective regions in the apparatus, the additional sensors configured to provide respective sensor outputs for configuring respective delay tap settings for respective additional delay elements in the different respective regions.

19. The apparatus of claim 11, further comprising a phase detector configured to operate as a part of a closed loop system;
wherein the sensor and the converter are parts of an open loop system;
wherein the closed loop system is configured to compensate for a first type of process variation; and
wherein the open loop system is configured to compensate for a second type of process variation.

20. An apparatus comprising
a first delay element configured to receive a clock signal from a clock, wherein the first delay element comprises multiple delay lines;
a first multiplexer coupled to the multiple delay lines;
a sensor configured to sense a voltage, a temperature, or both, and to provide a sensor output based at least on the sensed voltage and/or the sensed temperature;
a converter configured to receive the sensor output, and to generate a converted signal, wherein the first multiplexer is configured to provide a delay line output from one of the multiple delay lines based at least in part on the converted signal;
a phase detector configured to operate as a part of a closed loop system to compensate for process variation;
wherein the sensor and the converter are parts of an open loop system configured to compensate for time varying component of a clock system while the closed loop system is compensating for the process variation;
wherein the closed loop system is configured to be turned off after the process variation is compensated; and
wherein the open loop system is configured to continue to operate to compensate for the time varying component of the clock system after the closed loop system is turned off.

\* \* \* \* \*